(12) United States Patent
Iwasaka et al.

(10) Patent No.: US 11,008,180 B2
(45) Date of Patent: May 18, 2021

(54) SWIRL FLOW-FORMING BODY AND SUCTION DEVICE

(71) Applicant: HARMOTEC CO., LTD., Kofu (JP)

(72) Inventors: Hitoshi Iwasaka, Kofu (JP); Yuji Kasai, Kofu (JP); Hideyuki Tokunaga, Kofu (JP); Katsuhiro Koshiishi, Kofu (JP); Hidemitsu Tanaka, Kofu (JP); Katsutoshi Minoura, Kofu (JP)

(73) Assignee: HARMOTEC CO., LTD., Kofu (JP)

( * ) Notice: Subject to any disclaimer, the term of this patent is extended or adjusted under 35 U.S.C. 154(b) by 158 days.

(21) Appl. No.: 16/304,189

(22) PCT Filed: May 18, 2017

(86) PCT No.: PCT/JP2017/018686
§ 371 (c)(1),
(2) Date: Nov. 23, 2018

(87) PCT Pub. No.: WO2017/212889
PCT Pub. Date: Dec. 14, 2017

(65) Prior Publication Data
US 2020/0140211 A1    May 7, 2020

(30) Foreign Application Priority Data
Jun. 8, 2016  (JP) .............................. JP2016-114498

(51) Int. Cl.
*B65G 47/91* (2006.01)
*B25J 15/06* (2006.01)
(Continued)

(52) U.S. Cl.
CPC ......... *B65G 47/911* (2013.01); *B25J 15/0616* (2013.01); *B65G 49/061* (2013.01);
(Continued)

(58) Field of Classification Search
CPC .. B65G 47/911; B65G 49/061; B65G 49/064; B25J 15/0616; H01L 21/67784; H01L 21/6838
(Continued)

(56) References Cited

U.S. PATENT DOCUMENTS 4,921,520 A * 5/1990 Carlomagno ........ B65G 47/911
65/111
5,067,762 A * 11/1991 Akashi ................. B25J 15/0616
271/97
(Continued)

FOREIGN PATENT DOCUMENTS

JP     H10-167470 A    6/1998
JP     2005-051260 A   2/2005
(Continued)

OTHER PUBLICATIONS

Jan. 8, 2020 Search Report issued in European Patent Application No. 17810070.7.
(Continued)

*Primary Examiner* — Paul T Chin
(74) *Attorney, Agent, or Firm* — Oliff PLC

(57) ABSTRACT

Swirl flow-forming body includes main body, first end face that is formed at main body and faces a member to which suction is applied, hole that opens on first end face, jetting port that is formed on inner periphery of main body, inner periphery facing hole, and fluid passage that allows fluid to be discharged into hole via jetting port so as to form a swirl flow that generates negative pressure for applying suction to the member. Inner periphery is formed so as to guide fluid discharged via jetting port, in a direction away from the member, to be discharged from hole.

11 Claims, 13 Drawing Sheets

(51) Int. Cl.
*H01L 21/677* (2006.01)
*B65G 49/06* (2006.01)
*H01L 21/683* (2006.01)

(52) U.S. Cl.
CPC ...... *B65G 49/064* (2013.01); *H01L 21/67784* (2013.01); *H01L 21/6838* (2013.01); *B65G 2201/022* (2013.01); *B65G 2249/045* (2013.01)

(58) Field of Classification Search
USPC ........................................ 294/183, 64.2, 64.3
See application file for complete search history.

(56) References Cited

U.S. PATENT DOCUMENTS

| | | | | |
|---|---|---|---|---|
| D530,352 S | * | 10/2006 | Iwasaka | D15/199 |
| 7,360,322 B2 | * | 4/2008 | Iwasaka | H01L 21/67784 |
| | | | | 294/188 |
| 8,528,886 B2 | * | 9/2013 | Chang | H01L 21/78 |
| | | | | 269/20 |
| 8,905,680 B2 | * | 12/2014 | Lee | H01L 21/6838 |
| | | | | 406/87 |
| 9,062,689 B2 | | 6/2015 | Schaaf | |
| 9,738,337 B2 | | 8/2017 | Li | |
| 10,189,166 B2 | * | 1/2019 | Iwasaka | H01L 21/67781 |
| 2013/0032981 A1 | | 2/2013 | Schaaf | |
| 2013/0033728 A1 | * | 2/2013 | Hinds | G06K 15/1889 |
| | | | | 358/1.16 |
| 2013/0129464 A1 | * | 5/2013 | Regan | B25J 15/0625 |
| | | | | 414/800 |
| 2014/0062112 A1 | | 3/2014 | Cho | |
| 2016/0300749 A1 | * | 10/2016 | Iwasaka | B65G 49/061 |
| 2016/0300750 A1 | * | 10/2016 | Iwasaka | B65G 49/061 |
| 2018/0065257 A1 | * | 3/2018 | Iwasaka | H01L 21/67766 |
| 2019/0222679 A1 | * | 7/2019 | Parker | H04N 21/44004 |

FOREIGN PATENT DOCUMENTS

| | | |
|---|---|---|
| JP | 2006-339234 A | 12/2006 |
| JP | 2014-516810 A | 7/2014 |
| KR | 10-2012-0088847 A | 8/2012 |
| WO | 2015/113492 A1 | 8/2015 |

OTHER PUBLICATIONS

Dec. 11, 2018 International Preliminary Report on Patentability issued in International Patent Application No. PCT/JP2017/018686.

Jul. 4, 2017 International Search Report issued in International Patent Application No. PCT/JP2017/018686.

Nov. 28, 2017 Office Action issued in Japanese Patent Application No. 2016-114498.

Apr. 22, 2020 Office Action issued in Korean Patent Application No. 10-2018-7037496.

Oct. 12, 2020 Office Action issued in Korean Patent Application No. 10-2018-7037496.

* cited by examiner

SWIRL FLOW-FORMING BODY AND SUCTION DEVICE

TECHNICAL FIELD

The present invention pertains to a swirl flow-forming body that forms a swirl flow generating a negative pressure, which applies suction to a member.

BACKGROUND ART

In recent years, there has been developed a device for non-contact conveyance of a plate-like member, such as a semiconductor wafer or a glass substrate. For example, in Patent Document 1, a device is proposed for conveying a plate-like member in a non-contact manner, by applying Bernoulli's principle. The device includes a cylindrical chamber that opens on an underside of the device. Fluid is supplied into the chamber to generate a swirl flow having a central negative pressure, which exerts suction on the plate-like member. Fluid flowing out of the cylindrical chamber causes a given distance to be maintained between the device and the plate-like member, thereby enabling non-contact conveyance by the device of the plate-like member.

PRIOR ART DOCUMENT

Patent Document

Patent Document 1: JP 2005-51260 A1

SUMMARY OF THE INVENTION

Problems to be Solved by the Invention

The object of the present invention is the provision of a swirl flow-forming body that includes a jetting port and a hole into which fluid is discharged such that a swirl flow is formed that generates a negative pressure for applying suction to a member, the swirl flow-forming body making it possible to apply suction to the member in a manner that is more stable than in a case where fluid from a jetting port is discharged toward the member.

Means for Solving the Problems

To solve the problem described above, the present invention provides a swirl flow-forming body, comprising: a main body; a first end face that is formed at the main body and faces a member to which suction is applied; a hole that opens on the first end face; a jetting port that is formed on an inner periphery of the main body, the inner periphery facing the hole; and a first fluid passage that allows fluid to be discharged into the hole via the jetting port so as to form a swirl flow that generates negative pressure for applying suction to the member, wherein the inner periphery is formed so as to guide fluid discharged via the jetting port, in a direction away from the member, to be discharged from the hole.

In a preferred mode of the invention, at least part of the inner periphery is formed such that a cross-sectional area of the hole expands with distance from the member.

In a further preferred mode of the invention, the hole is a through-hole that opens on the first end face and a second end face opposite to the first end face, and the inner periphery is formed so as to guide fluid discharged via the jetting port, toward an opening of the second end face.

In a further preferred mode of the invention, the inner periphery is formed such that a cross-sectional area of the hole gradually enlarges with distance from the member from an opening of the first end face to the opening of the second end face.

In a further preferred mode of the invention, the second end surface includes a chamfered or rounded opening edge.

In a further preferred mode of the invention, the swirl flow-forming body further comprises: a plate body; and a holding member that holds the plate body such that the plate body faces the second end face, and that forms, between the second end face and the plate body, a flow path for fluid that has flowed out from the hole.

In a further preferred mode of the invention, the holding member holds the plate body such that the plate body is able to move in a penetration direction of the through-hole.

In another preferred mode of the invention, the swirl flow-forming body further comprises: an outlet port that is formed on the inner periphery at a position farther away from the member than the jetting port; a discharge port that is formed on an outside surface of the main body; and a second fluid passage that allows fluid that has entered the outlet port to be discharged, wherein the inner periphery is formed so as to guide fluid discharged via the jetting port, toward outlet port.

In another preferred mode of the invention, the first fluid passage is formed such that fluid discharged through the jetting port flows in a direction away from the member.

The present invention also provides a swirl flow-forming body, comprising: a main body; a first end face that is formed at the main body and faces a member to which suction is applied; a hole that opens on the first end face; a jetting port that is formed on an inner periphery of the main body, the inner periphery facing the hole; and a first fluid passage that allows fluid to be discharged into the hole via the jetting port so as to form a swirl flow that generates negative pressure for applying suction to the member, wherein the first fluid passage is formed so as to allow fluid discharged via the jetting port to flow in a direction away from the member to be discharged from the hole.

The present invention also provides a suction device, comprising: a base body; and at least one swirl flow-forming body according to any one of Claims 1 to 10, provided in the base body.

Effects of the Invention

The present invention provides a swirl flow-forming body that includes a jetting port and a hole into which fluid is discharged such that a swirl flow is formed that generates a negative pressure for applying suction to a member, the swirl flow-forming body making it possible to apply suction to the member in a manner that is more stable than in a case where fluid from a jetting port is discharged toward the member.

Figure 1:
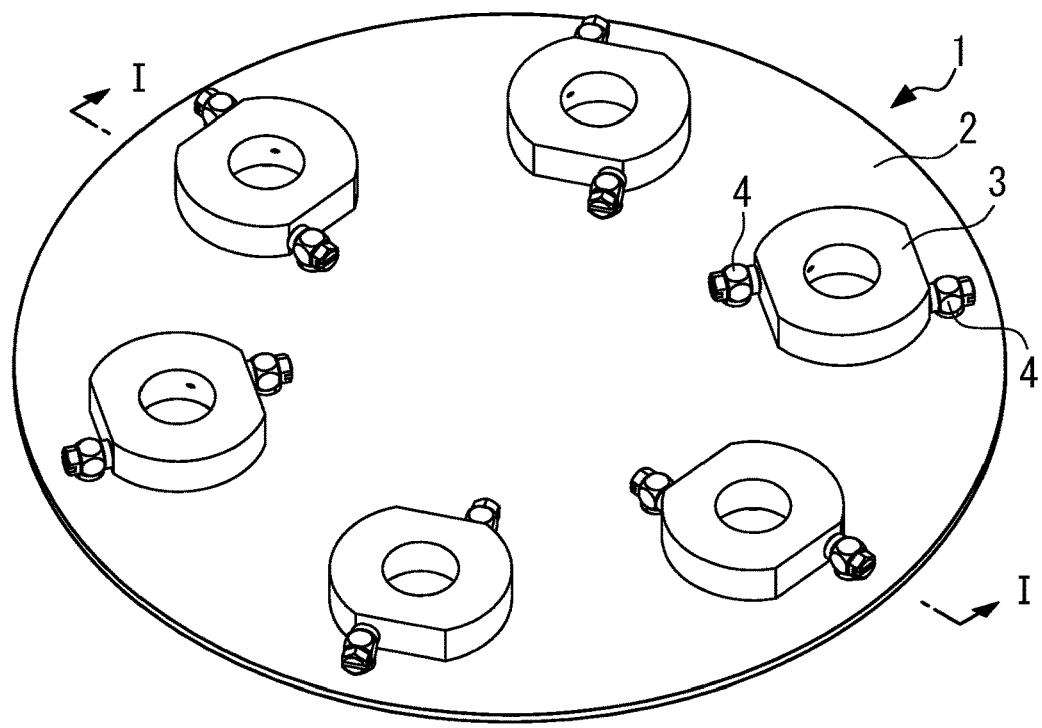
FIG. 1 is a perspective view of an example of an upper surface of suction device 1.

DESCRIPTION OF REFERENCE NUMERALS 1, 1A, 1B, 1C, 1D, 1E, 1F, 1G, 1H, 1I . . . suction device, 2, 2A, 2B, 2C, 2D, 2E, 2F, 2G, 2H . . . base plate, 3, 3A, 3B, 3C, 3D, 3E, 3F, 3G, 3H, 3I, 3J, 3K . . . swirl flow-forming body, 4 . . . fluid coupling, 6, 6A . . . base body, 7, 7A . . . cover, 8 . . . baffle plate, 9 . . . guide shaft, 21 . . . through-hole, 22 . . . through-hole, 23 . . . through-hole, 24 . . . through-hole, 25 . . . through-hole, 26 . . . through-hole, 31 . . . main body, 32 . . . through-hole, 33 . . . first end face, 34 . . . second end face, 35 . . . jetting port, 36 . . . supply port, 37, 37A . . . fluid passage, 38, 38A . . . cover, 39, 39A . . . spacer, 51 . . . outlet port, 52 . . . discharge port, 53 . . . fluid passage, 54 . . . discharge flow control cover, 55 . . . discharge flow control valve, 61 . . . inner periphery, 62 . . . outer periphery, 63 . . . edge end face, 81 . . . slit, 311 . . . inner periphery, 312 . . . outer periphery, 313 . . . inclined surface, 314 . . . curved surface, 315 . . . inner periphery, 316 . . . inner periphery, 381 . . . groove

MODES FOR IMPLEMENTING THE INVENTION

Embodiments of the present invention are explained below with reference to the drawings.

1. EMBODIMENT

Figure 2:
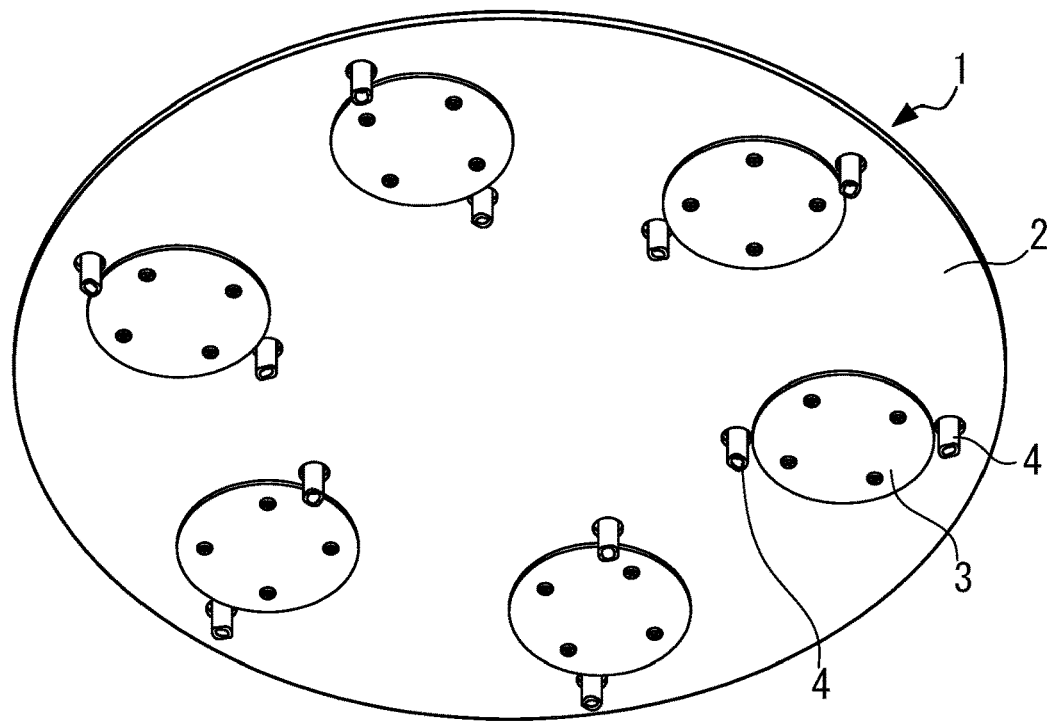
FIG. 2 is a perspective view of an example of a lower surface of suction device 1.
Figure 3:
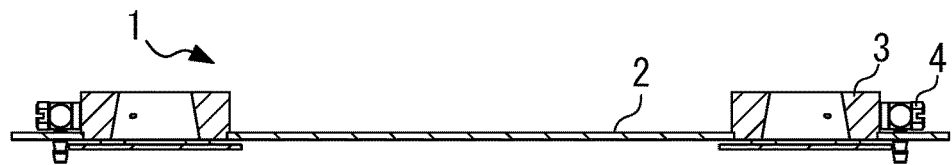
FIG. 3 is a cross-sectional view of suction device 1 along line I-I shown in FIG. 1.

FIG. 1 is a perspective view of an example of an upper surface of suction device 1 according to an embodiment of the present invention. FIG. 2 is a perspective view of an example of a lower surface of suction device 1. FIG. 3 is a cross-sectional view of suction device 1 along line I-I shown in FIG. 1. Suction device 1 is a device for applying suction to a plate-like member such as a cooking ingredient whereby the member can be held and conveyed. Suction device 1 includes base plate 2 that is a disk-shaped base body, six swirl flow-forming bodies 3 that are provided in base plate 2 and form a fluid swirl flow, and liquid couplings 4 that connect a tube extending from a fluid supply pump (not shown) to swirl flow-forming body 3.

Base plate 2 includes six through-holes having a substantially circular cross section formed along the outer edge of the base plate at regular intervals. Swirl flow-forming body 3 is fitted into each of the through-holes such that main body 31 is exposed on an upper surface side of base plate 2 and cover 38 is exposed on a lower surface side of base plate 2. Swirl flow-forming bodies 3 are provided in base plate 2 such that bodies that form a clockwise swirl flow and bodies that form a counterclockwise swirl flow are arranged alternately. It is of note that a fluid herein refers to a gas such as compressed air, or a liquid such as pure water or carbonated water.

Figure 4:
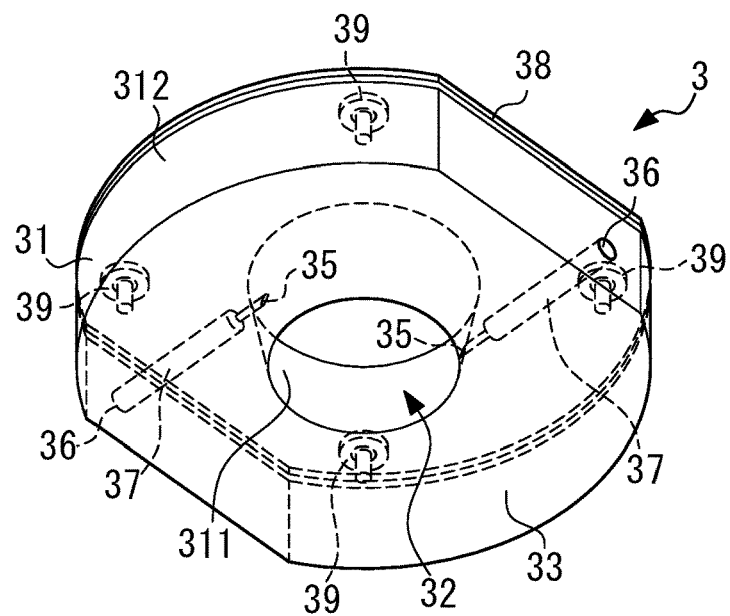
FIG. 4 is a perspective view of an example of a lower surface of swirl flow-forming body 3.
Figure 5:
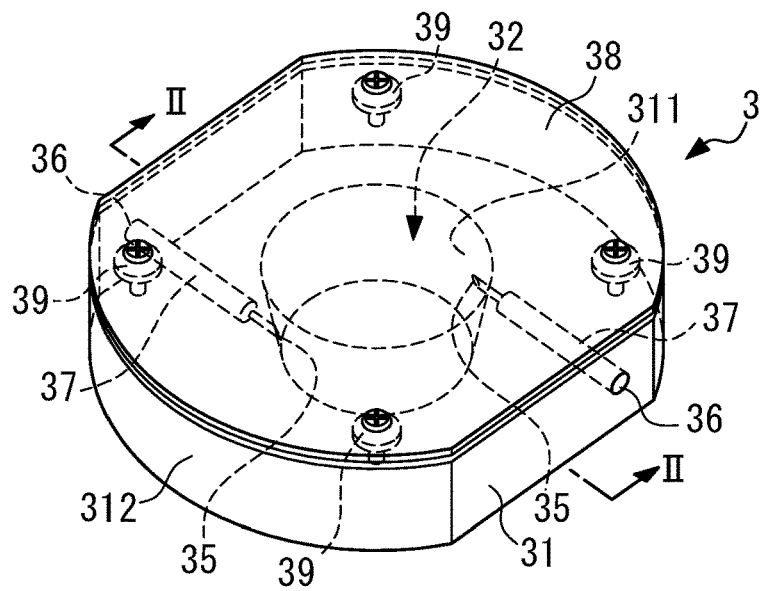
FIG. 5 is a perspective view of an example of an upper surface of swirl flow-forming body 3.
Figure 6:
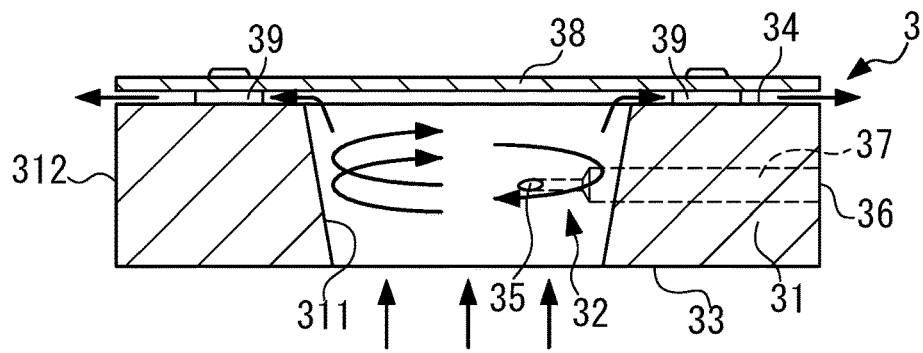
FIG. 6 is a cross-sectional view of swirl flow-forming body 3 along line II-II shown in FIG. 5.

FIG. 4 is a perspective view of an example of a lower surface of swirl flow-forming body 3. FIG. 5 is a perspective view of an example of an upper surface of swirl flow-forming body 3. FIG. 6 is a cross-sectional view of swirl flow-forming body 3 along line II-II shown in FIG. 5. Swirl flow-forming body 3 is a device for applying suction to a plate-like member by use of Bernoulli's principle so that the member can be held. Swirl flow-forming body 3 includes: main body 31 that is a substantially cylindrical body including through-hole 32 that is formed at the center of the cylindrical body and has a circular cross section; flat first end face 33 that is formed on the lower surface of main body 31 such that first end face 33 opposes a plate-like member; flat second end face 34 that is formed on the upper surface of main body 31; two jetting ports 35 that are formed on inner periphery 311 of main body 31 that faces through-hole 32; two supply ports 36 that are formed on outer periphery 312 of main body 31; two straight fluid passages 37 that connect jetting port 35 and supply port 36; cover 38 that has a substantially disk shape; and four spacers 39 that are members for holding cover 38 such that cover 38 opposes and is parallel to second end face 34.

The outer periphery of a cross-section of main body 31 that is substantially perpendicular to the central axis has a shape of a circle, a part of which is replaced with a straight line. Inner periphery 311 of main body 31 is tapered such that a cross-section of inner periphery 311 that is substantially perpendicular to the central axis of main body 31 gradually enlarges from the opening of first end face 33 toward the opening of second end face 34. Inner periphery 311 guides a fluid discharged from jetting port 35, in a direction away from a member, to be discharged from through-hole 32. Specifically, inner periphery 311 guides the fluid toward the opening of second end face 34 to be discharged from through-hole 32.

Through-hole 32 is formed so as to extend straight in a direction of the central axis of main body 31. Through-hole 32 opens on first end face 33 and second end face 34.

First end face 33 and second end face 34 are formed so as to be substantially perpendicular to the central axis of main body 31.

Jetting ports 35 are formed in the center of inner periphery 311 in a direction of the central axis of main body 31. Jetting ports 35 are arranged in point symmetry about the central axis of main body 31. Supply ports 36 are formed at the center of outer periphery 312 in a direction of the central axis of main body 31. Supply ports 36 are arranged in point symmetry about the central axis of main body 31. Each of supply ports 36 is connected to liquid coupling 4.

Fluid passages 37 are formed so as to extend substantially perpendicular to the central axis of main body 31, and extend in a direction tangential to the inner periphery of main body 31. Fluid passages 37 extend parallel to each other. The diameter of fluid passages 37 reduces just before jetting port 35. Fluid passages 37 discharge a fluid from jetting ports 35 into through-hole 32. The fluid discharged into through-hole 32 flows along the inner periphery of main body 31 due to the Coanda effect, so that a swirl flow is formed within through-hole 32. Most of the fluid molecules included in the swirl flow out of through-hole 32 and then flow along second end face 34 at an angle of approximately 45 degrees to a direction in which fluid passage 37 that has discharged the fluid molecules extends. The swirl flow formed within through-hole 32 entrains a fluid remaining still in the center of through-hole 32, so that negative pressure is generated in the center of through-hole 32. The generated negative pressure applies suction to a member that opposes first end face 33. It is of note that the above angle of approximately 45 degrees is merely one example. An angle at which fluid molecules flow out of through-hole 32 and then flow along second end face 34 is determined by a diameter or depth of through-hole 32 and a flow speed of the fluid.

Cover 38 has a shape similar to the outer periphery of a cross-section of main body 31 that is substantially perpendicular to the central axis. Cover 38 covers through-hole 32 to control inflow of external fluid (specifically, gas or liquid) to through-hole 32.

Spacers 39 have a columnar shape. Spacers 39 are provided along the outer edge of second end face 34 at regular intervals such that spacers 39 extend toward cover 38 in a substantially vertical direction to couple main body 31 and cover 38. Spacers 39 are fixed on main body 31 and cover 38 by use of screws, for example. Spacers 39 form, between second end face 34 and cover 38, a flow path that allows a fluid flowing out of through-hole 32 to flow to be discharged out of swirl flow-forming body 3. The height of spacers 39 (that is, the gap between second end face 34 and cover 38) is determined based on the flow amount of fluid supplied from the fluid supply pump to swirl flow-forming body 3. Spacers 39 are preferably provided on second end face 34 so as not to obstruct a flow path of a fluid flowing out of through-hole 32. This is to prevent turbulent flow from occurring due to collision of a fluid flowing out of through-hole 32 and spacers 39. A flow path of a fluid flowing out of through-hole 32 is determined by the diameter or depth of through-hole 32 and flow speed of the fluid. For example, spacers 39 are preferably not provided on a line at approximately 45 degrees to a direction in which fluid passage 37 extends.

When swirl flow-forming body 3 of suction device 1 described in the foregoing is supplied with fluid via fluid coupling 4, the fluid passes through supply port 36 and fluid passage 37 to be discharged from jetting port 35 into through-hole 32. The fluid discharged into through-hole 32 creates a swirl flow within through-hole 32. Most of the fluid molecules included in the swirl flow are guided by inner periphery 311 to flow out of through-hole 32 and then flow along second end face 34. At this time, if a plate-like member is present in a position that opposes first end face 33, inflow of external fluid (specifically, gas or liquid) to through-hole 32 is limited, and the density of fluid molecules per unit volume in the center of the swirl flow lessens due to centrifugal force and the entrainment effect of the swirl flow; namely, negative pressure is generated in the center of the swirl flow. As a result, pressure is applied to the member by surrounding fluid and gravitates towards first end face 33.

As described in the foregoing, in swirl flow-forming body 3, most of the fluid molecules flowing out of through-hole 32 flow along second end face 34 to be discharged, and a small number, if any, of fluid molecules flow along first end face 33 to be discharged, so that fluid is prevented from colliding with a plate-like member. As a result, undulation and rotation of the plate-like member is controlled as compared with a case where fluid is not discharged at the side of second end face 34; in other words, the plate-like member can be held and conveyed in a stable manner. Also, occurrence of creases, deformation, or damage in the plate-like member resulting from undulation is controlled. Suction device 1 makes possible use of the suction force of the swirl flow that is formed within swirl flow-forming body 3 in isolation.

2. MODIFIED EXAMPLES

The embodiment described above may be modified as described below. It is of note that the following modified examples may be combined.

2-1. Modified Example 1

Figure 7:
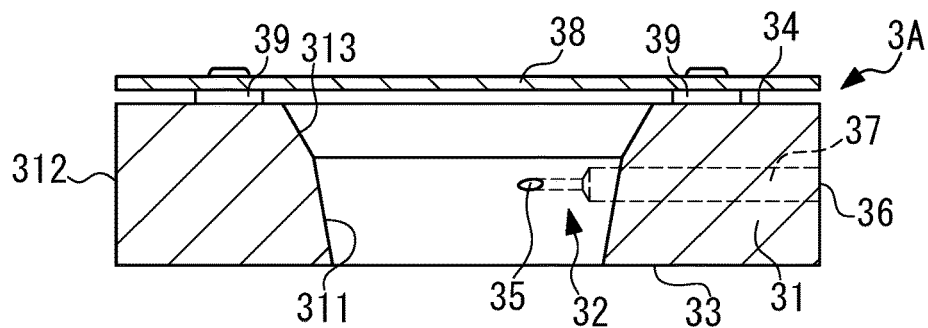
FIG. 7 is a vertical cross-sectional view of an example of swirl flow-forming body 3A.

The shape of inner periphery 311 of swirl flow-forming body 3 is not limited to the example shown in FIG. 6. FIG. 7 is a diagram showing a vertical cross-sectional view of an example of swirl flow-forming body 3A in which second end face 34 includes a chamfered opening edge. Swirl flow-forming body 3A includes inclined surface 313 formed at an end of inner periphery 311. Inclined surface 313 guides a fluid discharged from jetting port 35 in a direction away from a member, more specifically, toward the opening of second end face 34.

Figure 8:
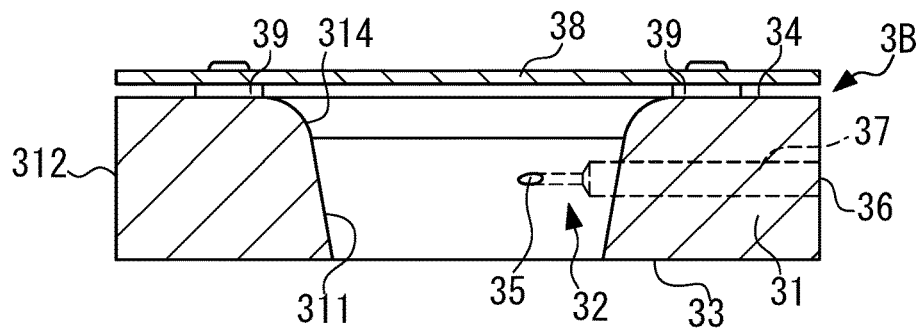
FIG. 8 is a vertical cross-sectional view of an example of swirl flow-forming body 3B.

FIG. 8 is a diagram showing a vertical cross-sectional view of an example of swirl flow-forming body 3B in which second end face 34 includes a rounded opening edge. Swirl flow-forming body 3B includes curved surface 314 formed at an end of inner periphery 311. Curved surface 314 guides a fluid discharged from jetting port 35 in a direction away from a member, more specifically, toward the opening of second end face 34.

Figure 9:
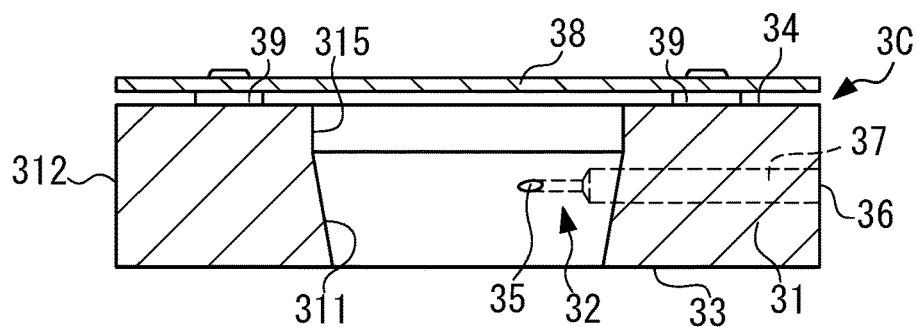
FIG. 9 is a vertical cross-sectional view of an example of swirl flow-forming body 3C.

FIG. 9 is a diagram showing a vertical cross-sectional view of an example of swirl flow-forming body 3C including inner periphery 311, a part of which is not tapered. Swirl flow-forming body 3C includes non-tapered inner periphery 315 formed from the middle between jetting port 35 and the opening of second end face 34 toward the opening of second end face 34. Inner periphery 315 is also formed approximately parallel to the central axis of main body 31.

Figure 10:
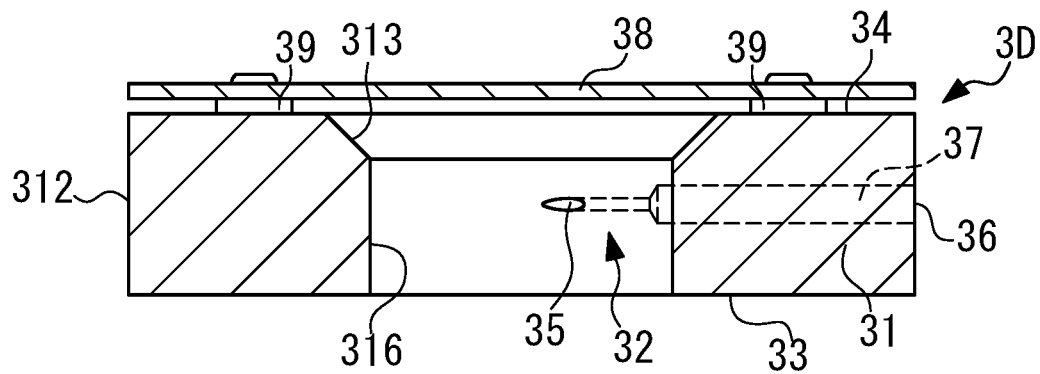
FIG. 10 is a vertical cross-sectional view of an example of swirl flow-forming body 3D.

FIG. 10 is a diagram showing a vertical cross-sectional view of an example of swirl flow-forming body 3D including non-tapered inner periphery 316, instead of tapered inner periphery 311, and including second end face 34 that includes a chamfered opening edge. Inner periphery 316 of swirl flow-forming body 3D is formed approximately parallel to the central axis of main body 31. Swirl flow-forming body 3D includes inclined surface 313 that is formed at an end of inner periphery 316. An effect of inclined surface 313 is described above.

Figure 11:
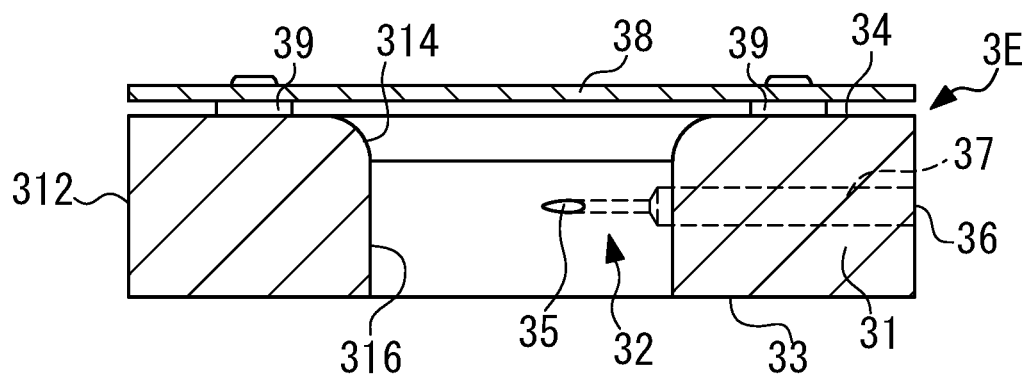
FIG. 11 is a vertical cross-sectional view of an example of swirl flow-forming body 3E.

FIG. 11 is a diagram showing a vertical cross-sectional view of an example of swirl flow-forming body 3E including non-tapered inner periphery 316, instead of tapered inner periphery 311, and including second end face 34 that includes a rounded opening edge. Inner periphery 316 of swirl flow-forming body 3E is formed approximately parallel to the central axis of main body 31. Swirl flow-forming body 3E includes curved surface 314 formed at an end of inner periphery 316. An effect of curved surface 314 is described above.

2-2. Modified Example 2

Figure 12:
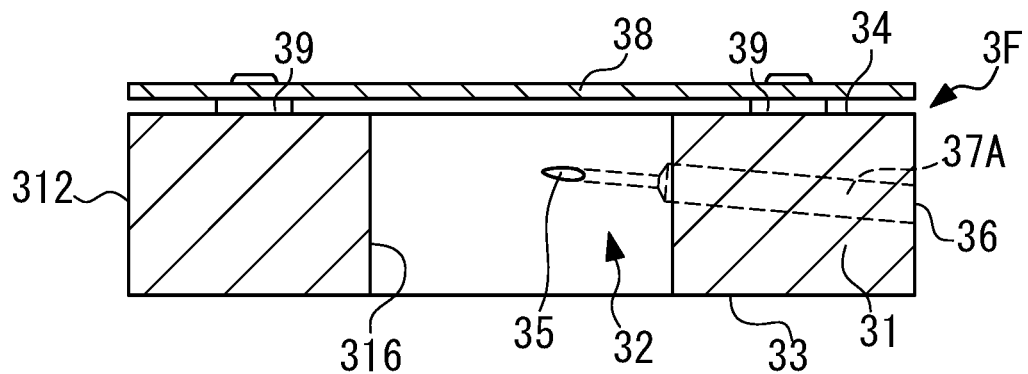
FIG. 12 is a vertical cross-sectional view of an example of swirl flow-forming body 3F.

Fluid passage 37 may be inclined in a direction approximately perpendicular to the central axis of main body 31. FIG. 12 is a diagram showing a vertical cross-sectional view of an example of swirl flow-forming body 3F including non-tapered inner periphery 316, instead of tapered inner periphery 311, and including fluid passage 37A that is inclined in a direction approximately perpendicular to the central axis of main body 31. Inner periphery 316 of swirl flow-forming body 3F is formed approximately parallel to the central axis of main body 31. Fluid passage 37A extends from supply port 36 to jetting port 35 such that fluid passage 37A is inclined toward second end face 34. Fluid passage 37A guides a fluid discharged from jetting port 35, in a direction away from a member (specifically, toward the opening of second end face 34), to be discharged from through-hole 32. It is of note that swirl flow-forming body 3F may include tapered inner periphery 311 instead of inner periphery 316. It also is of note that swirl flow-forming body 3F may include inclined surface 313 formed by chamfering the opening edge of second end face 34, or may include curved surface 314 formed by rounding the opening edge of second end face 34.

2-3. Modified Example 3

Figure 13:
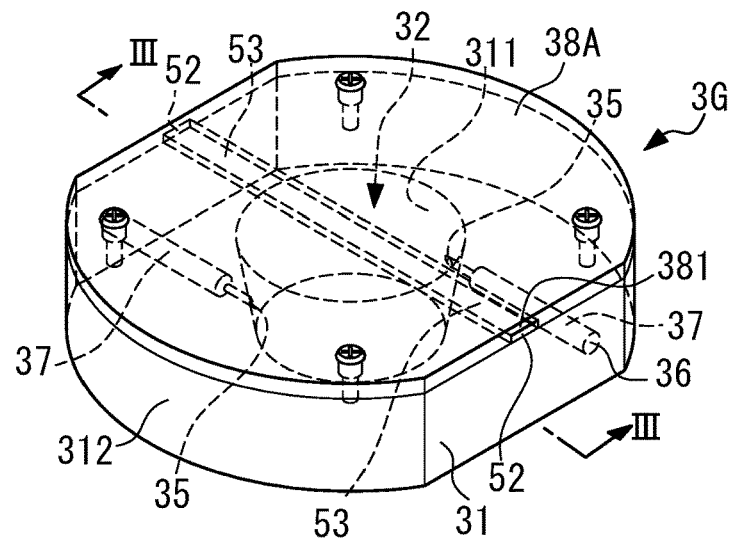
FIG. 13 is a perspective view of an example of an upper surface of swirl flow-forming body 3G.
Figure 14:
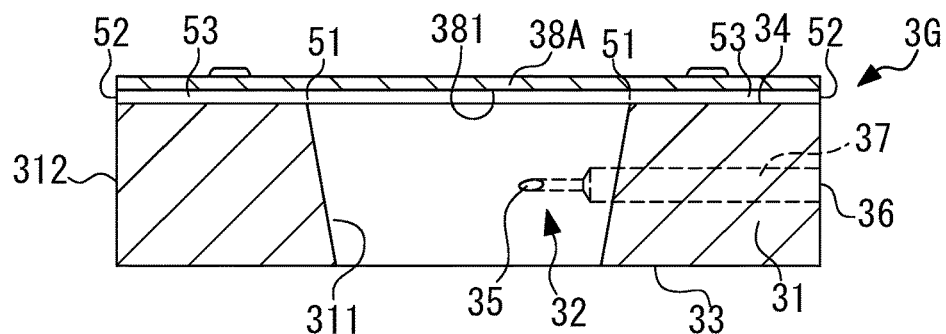
FIG. 14 is a cross-sectional view of swirl flow-forming body 3G along line III-III shown in FIG. 13.

Spacers 39 may be omitted, and a groove for discharging a fluid may be formed on a lower surface of cover 38. FIG. 13 is a perspective view of an example of an upper surface of swirl flow-forming body 3G that lacks spacers 39 and includes cover 38A that includes groove 381 formed on a lower surface thereof. FIG. 14 is a cross-sectional view of swirl flow-forming body 3G along line shown in FIG. 13. Cover 38A of swirl flow-forming body 3G differs from cover 38 in that it includes straight groove 381 having a U-shaped cross section formed at the center of a lower surface of cover 38A. Groove 381 also is formed such that groove 381 extends approximately parallel to fluid passage 37 of main body 31 to which cover 38A is attached. Cover 38A is fixed on main body 31 by use of screws, for example. With cover 38A fixed on main body 31, a combination of groove 381 and second end face 34 forms two outlet ports 51 that communicate with through-hole 32, two discharge ports 52 that face toward the outside of swirl flow-forming body 3G, and two straight fluid passages 53 that allow a fluid to flow from outlet port 51 to discharge port 52. Outlet ports 51 are formed at a position farther away from a member than jetting ports 35. Discharge ports 52 are formed at a position farther away from a member than supply ports 36. Fluid passages 53 are formed so as to extend in a radial direction of the inner circumference of main body 31. Fluid passages 53 are also formed in a straight line. Fluid passages 53 are also formed so as extend approximately perpendicularly to the central axis of main body 31. In swirl flow-forming body 3G, inner periphery 311 of main body 31 guides a fluid discharged from jetting ports 35 to outlet ports 51.

Figure 15:
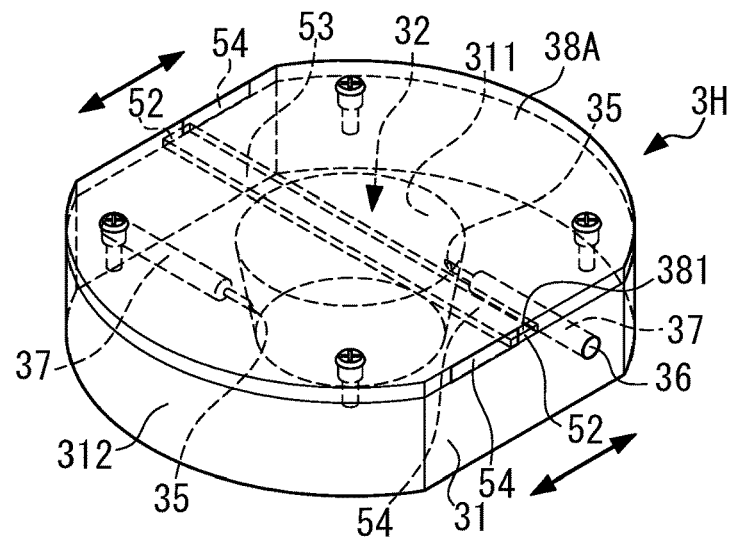
FIG. 15 is a perspective view of an example of an upper surface of swirl flow-forming body 3H.

Swirl flow-forming body 3G may be provided with a member for controlling the amount of fluid to be discharged from discharge port 53. FIG. 15 is a perspective view of an example of an upper surface of swirl flow-forming body 3H that includes discharge flow control covers 54. Discharge flow control covers 54 are rectangular plates that are attached to an outer edge of cover 38A such that they can cover and expose discharge port 52. Discharge flow control covers 54 may be slid laterally to control an area of discharge port 52 covered by discharge flow control cover 54 (in other words, the amount of fluid to be discharged from discharge port 52).

Figure 16:
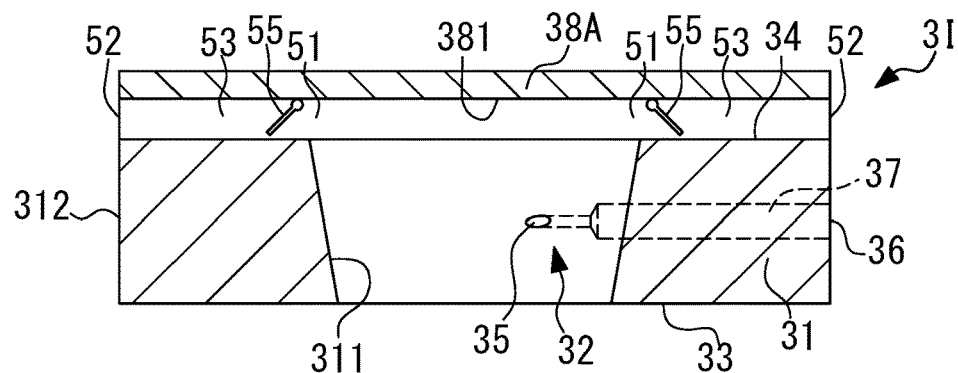
FIG. 16 is a vertical cross-sectional view of an example of swirl flow-forming body 3I.

FIG. 16 is a vertical cross-sectional view of an example of swirl flow-forming body 31 in which discharge flow control valve 55 is provided in fluid passages 53. Discharge flow control valve 55 is a rectangular plate that is attached in fluid passage 53 such that it can block and clear fluid passage 53. By controlling a degree of openness of discharge flow control valve 55, it is possible to control the amount of fluid to be discharged from discharge port 52.

It is of note that outlet ports 51 and discharge ports 52 are not limited to being circular in shape, and may be rectangular or elliptical. The number of outlet ports 51 and discharge ports 52 is not limited to two, and may be fewer or may be more. The cross-sectional shape of fluid passages 53 is not limited to being rectangular, and may be circular or elliptical. The number of fluid passages 53 is not limited to two, and may be fewer or may be more. Fluid passages 53 may be formed in a curved shape. Fluid passages 53 may also be inclined with respect to a direction approximately perpendicular to the central axis of main body 31. Specifically, fluid passages 53 may extend from discharge port 52 to outlet port 51 such that they are inclined toward second end face 34.

In a case where spacers 39 are omitted as described in the present modified example, main body 31 and cover 38 may be integrally formed. In such a case, two outlet ports 51 are formed on an inner periphery of main body 31A integral with cover 38, and two discharge ports 52 are formed on an outer periphery of the same main body. Outlet ports 51 and discharge ports 52 may be formed in the center of main body 31A in a direction of the central axis of main body 31A. An end of through-hole 32 is covered by cover 38 such that a concave part is provided. Even in a case where main body 31 and cover 38 are not integrally formed, a combination of them may be viewed as a single main body. A "main body" according to the present invention may include a combination of main body 31 and cover 38.

2-4. Modified Example 4

Figure 17:
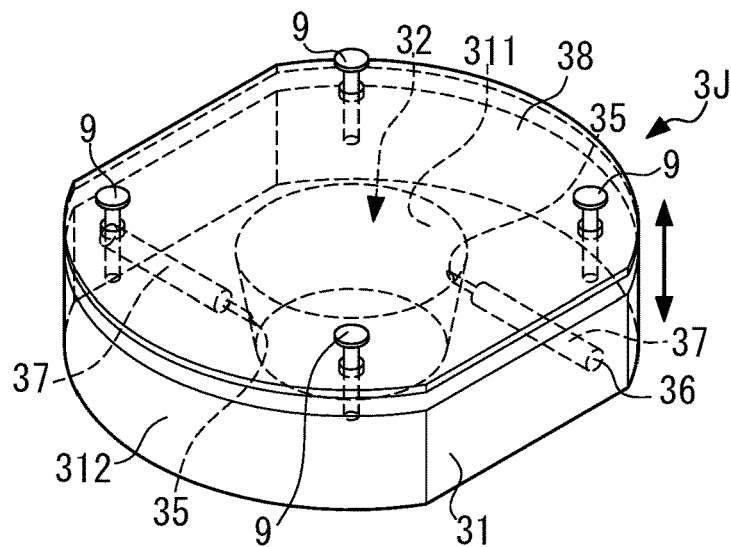
FIG. 17 is a perspective view of an example of an upper surface of swirl flow-forming body 3J.

Four spacers 39 may hold cover 38 in a movable manner, instead of holding cover 38 fixedly. FIG. 17 is a perspective view of an example of an upper surface of swirl flow-forming body 3J that includes four guide shafts 9 that are members for holding cover 38 in a movable manner. Each of guide shafts 9 of swirl flow-forming body 3J includes a head part having a diameter larger than that of a hole formed in cover 38, and a body part having a diameter smaller than that of the hole such that cover 38 is movable. Guide shafts 9 hold cover 38 such that cover 38 is able to move in the penetration direction of through-hole 32. By use of movable cover 38, a member passing through-hole 32 is prevented from becoming trapped between cover 38 and second end face 34.

2-5. Modified Example 5

Figure 18:
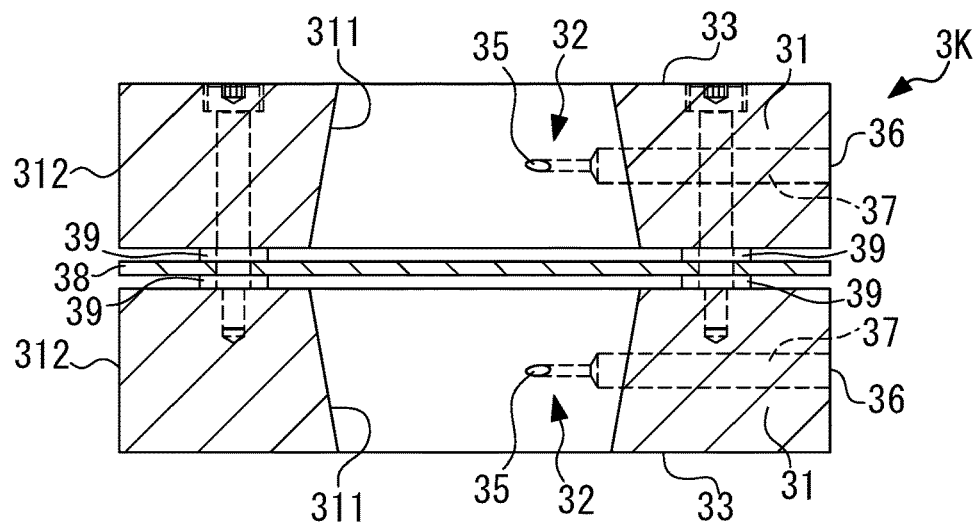
FIG. 18 is a vertical cross-sectional view of an example of swirl flow-forming body 3K.

Two swirl flow-forming bodies 3 may be used in combination. FIG. 18 is a vertical cross-sectional view of an example of swirl flow-forming body 3K that is a combination of two swirl flow-forming bodies 3 stacked such that second end faces 34 of the bodies face each other. Swirl flow-forming body 3K includes cover 38 that is shared by swirl flow-forming bodies 3. Main bodies of swirl flow-forming bodies 3 substantially share a central axis. Swirl flow-forming body 3K makes it possible to apply suction to two plate-like members so that they can be held simultaneously.

Figure 19:
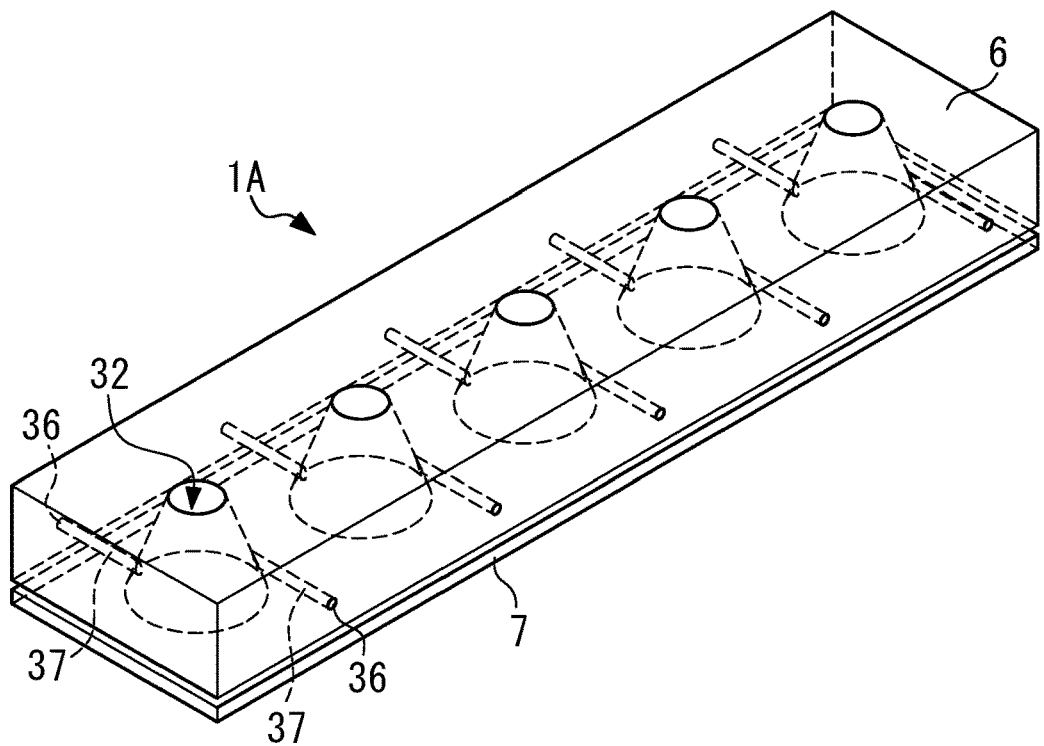
FIG. 19 is a perspective view of an example of suction device 1A.

FIG. 19 is a perspective view of an example of suction device 1A that is an integrated combination of swirl flow-forming bodies 3. Suction device 1A includes rectangular parallelepiped base body 6 that is an integrated combination of main bodies 31 of five swirl flow-forming bodies 3, and rectangular plate cover 7 that is an integrated combination of covers 38 of five swirl flow-forming bodies 3. Base body 6 includes through-holes 32 that are arranged in a straight line at regular intervals. Assuming that a member to which suction is applied is of a rod shape, through-holes 32 are arranged along the longitudinal direction of the member. Fluid passages 37 are arranged such that they extend approximately perpendicular to the longitudinal direction of base body 6. Suction device 1A is able to apply suction to a rod-shaped member so that it can be held, using negative pressures generated in through-holes 32. For example, suction device 1A may apply suction to a mechanical pencil lead or injection needle so that it can be held. It is of note that in FIG. 19, spacers 39 for connecting base body 6 to cover 7 are not shown. It also is of note that the shapes of base body 6 and cover 7, and the number and the arrangement of through-holes 32 are not limited to the example shown in FIG. 19.

Figure 20:
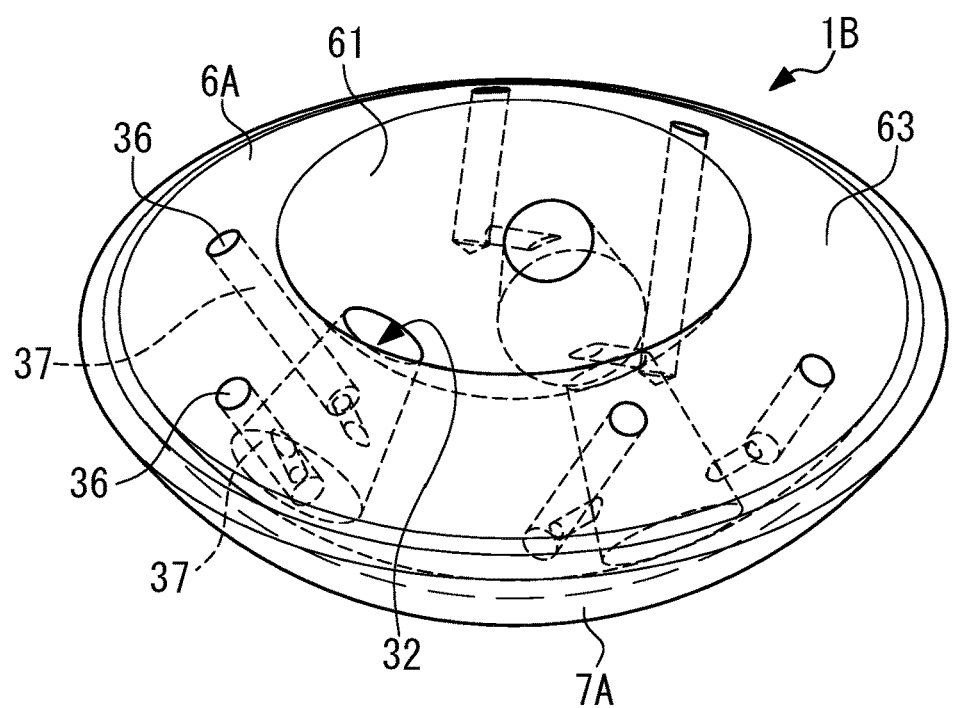
FIG. 20 is a perspective view of an example of suction device 1B.
Figure 21:
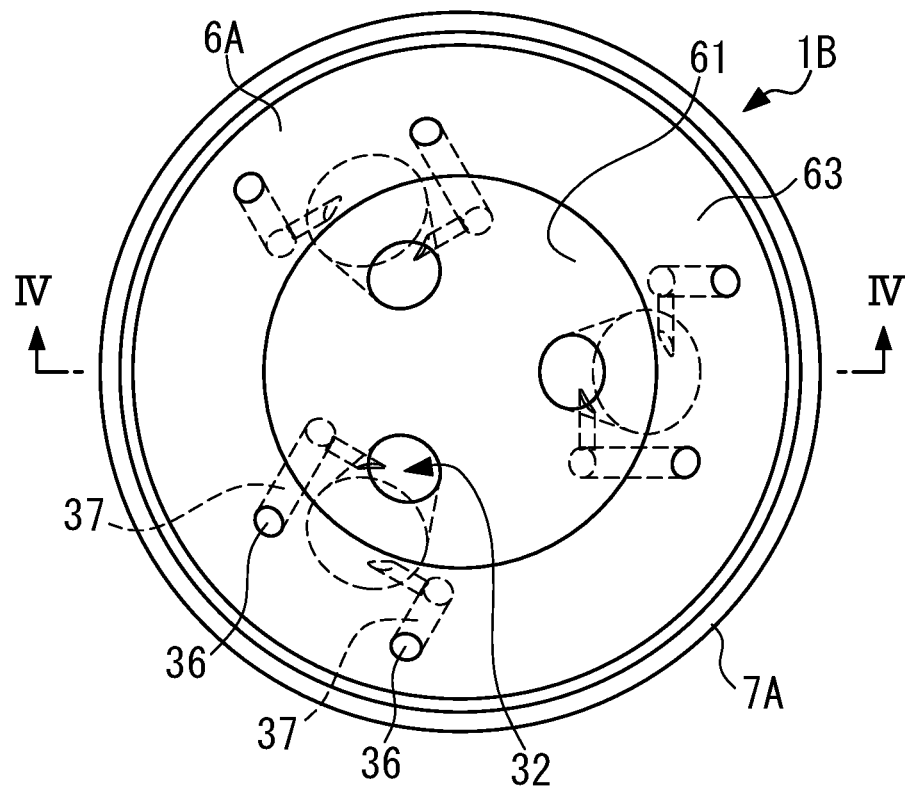
FIG. 21 is a plan view of an example of suction device 1B.
Figure 22:
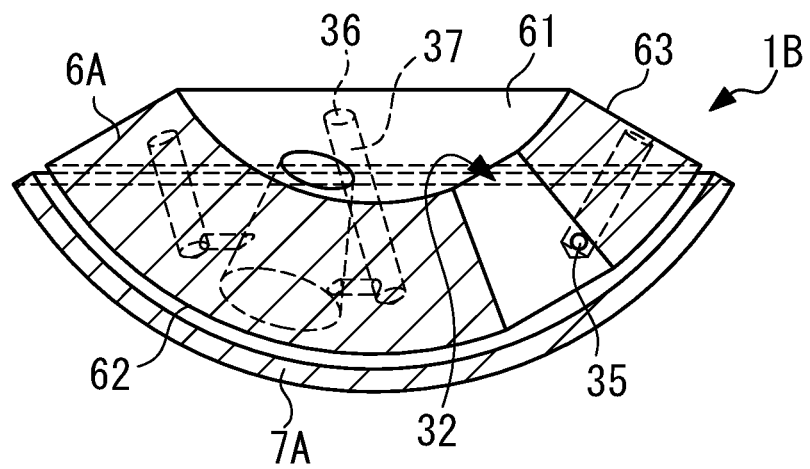
FIG. 22 is a cross-sectional view of suction device 1B along line Iv-Iv shown in FIG. 21.

FIG. 20 is a perspective view of an example of suction device 1B that is an integrated combination of swirl flow-forming bodies 3. FIG. 21 is a plan view of suction device 1B. FIG. 22 is a cross-sectional view of suction device 1B along line Iv-Iv shown in FIG. 21. Suction device 1B includes thick-walled substantially hemispherical shell-shaped base body 6A that is an integrated combination of main bodies 31 of three swirl flow-forming bodies 3, and thin-walled substantially hemispherical shell-shaped cover 7A that is an integrated combination of covers 38 of three swirl flow-forming bodies 3. Base body 6A includes substantially hemispherical inner periphery 61 and outer periphery 62, and annular edge end face 63. Inner periphery 61 is formed so as to fit a curved surface of a member to which suction is applied. Through-holes 32 open on inner periphery 61 and outer periphery 62. Through-holes 32 are arranged along the edge of inner periphery 61 at regular intervals, and are formed so as to extend linearly in a radial direction of base body 6A. Supply ports 36 open on edge end face 63. Cover 7A is attached to base body 6A such that cover 7A covers outer periphery 62. It is of note that in FIGS. 20 to 22, spacers for connecting cover 7A to base body 6A are not shown. Suction device 1B is able to apply suction to a spherical member so that it can be held, by way of negative pressures generated in through-holes 32. It is also of note that the shapes of base body 6A and cover 7A, and the number and the arrangement of through-holes 32 are not limited to the example shown in FIGS. 20 to 22.

2-6. Modified Example 6

Figure 23:
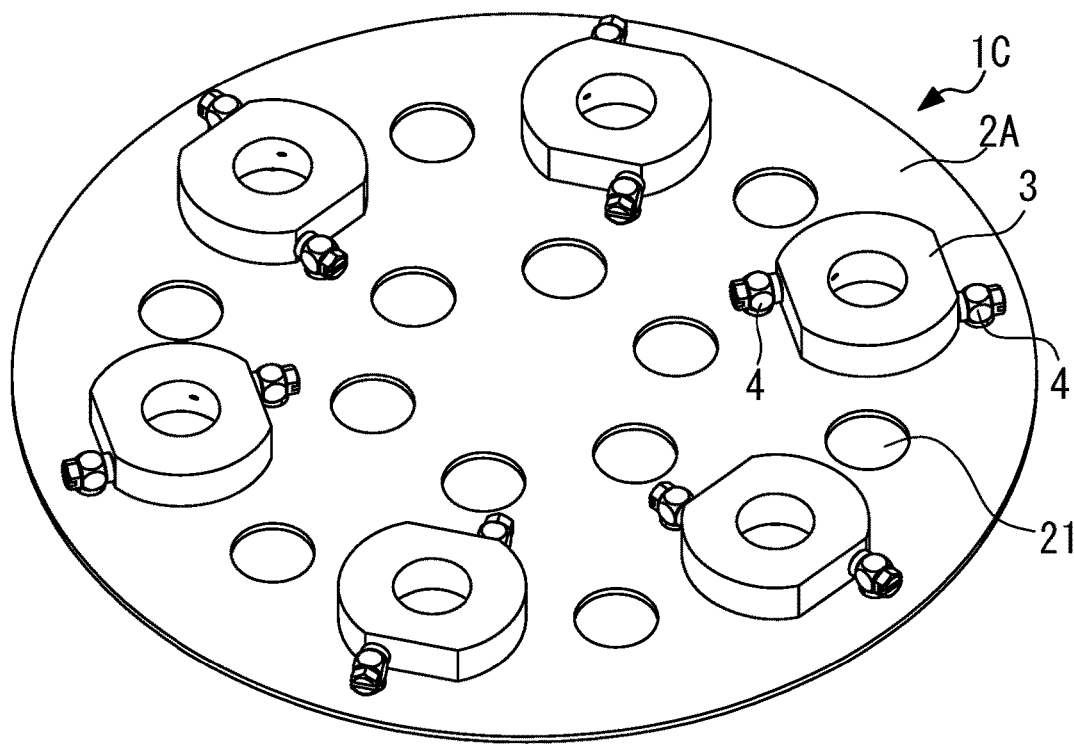
FIG. 23 is a perspective view of an example of an upper surface of suction device 1C.

Base plate 2 of suction device 1 may include through holes. FIG. 23 is a perspective view of an example of an upper surface of suction device 1C that includes base plate 2A in which through-holes 21 are formed. Base plate 2A of suction device 1C includes six through-holes 21 that are formed, at regular intervals, around a circle on which swirl flow-forming bodies 3 are arranged. Through-holes 21 and swirl flow-forming bodies 3 are arranged alternately. Base plate 2A also includes six through-holes 21 that are formed, at regular intervals, around a circle having a smaller diameter than the circle on which swirl flow-forming bodies 3 are arranged, and sharing a center with the circle. It is of note that the shape, the number, and the arrangement of through-holes 21 are not limited to the example shown in FIG. 23.

2-7. Modified Example 7

Figure 24:
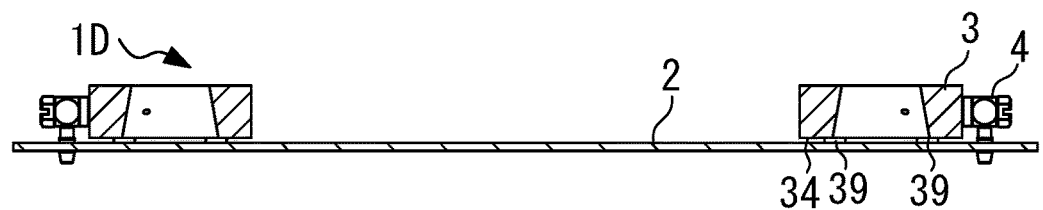
FIG. 24 is a vertical cross-sectional view of an example of suction device 1D.

Covers 38 of swirl flow-forming bodies 3 may be integrated with base plate 2. FIG. 24 is a vertical cross-sectional view of an example of suction device 1D in which base plate 2 serves as covers 38 of swirl flow-forming bodies 38. Swirl flow-forming bodies 3 of suction device 1D include four spacers 39 that extend from second end face 34 toward base plate 2 in a substantially vertical direction to couple main body 31 and base plate 2. Spacers 39 form, between second end face 34 and base plate 2, a flow path for a fluid that has flowed out of through-hole 32. Base plate 2 of suction device 1D may include through-holes 21, as in the case of base plate 2A.

2-8. Modified Example 8

Figure 25:
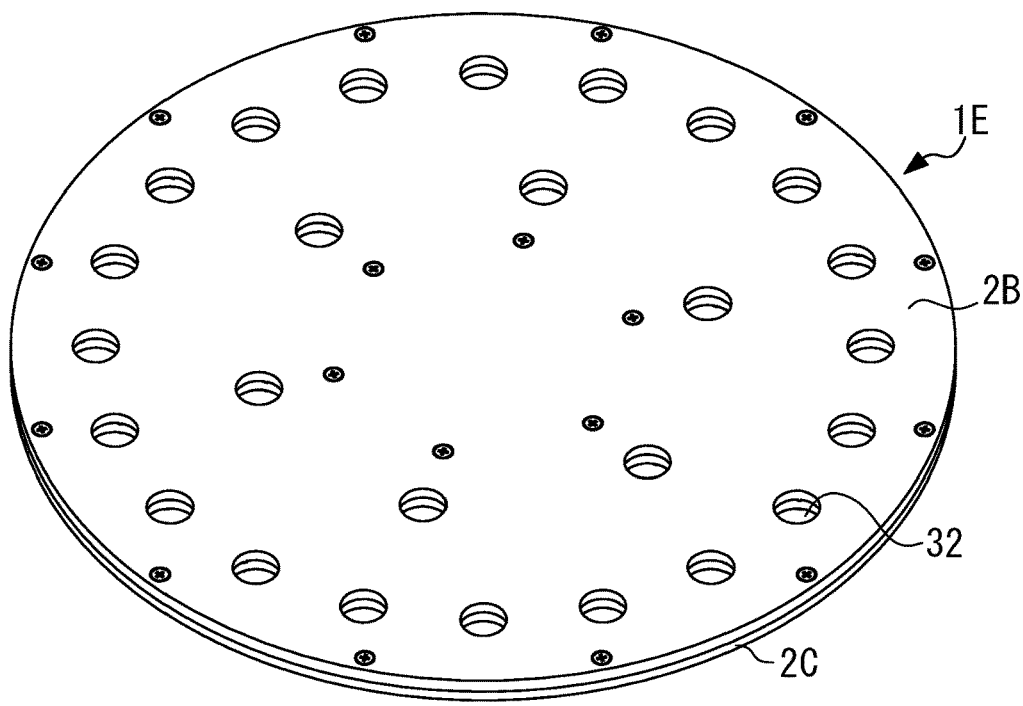
FIG. 25 is a perspective view of an example of an upper surface of suction device 1E.
Figure 26:
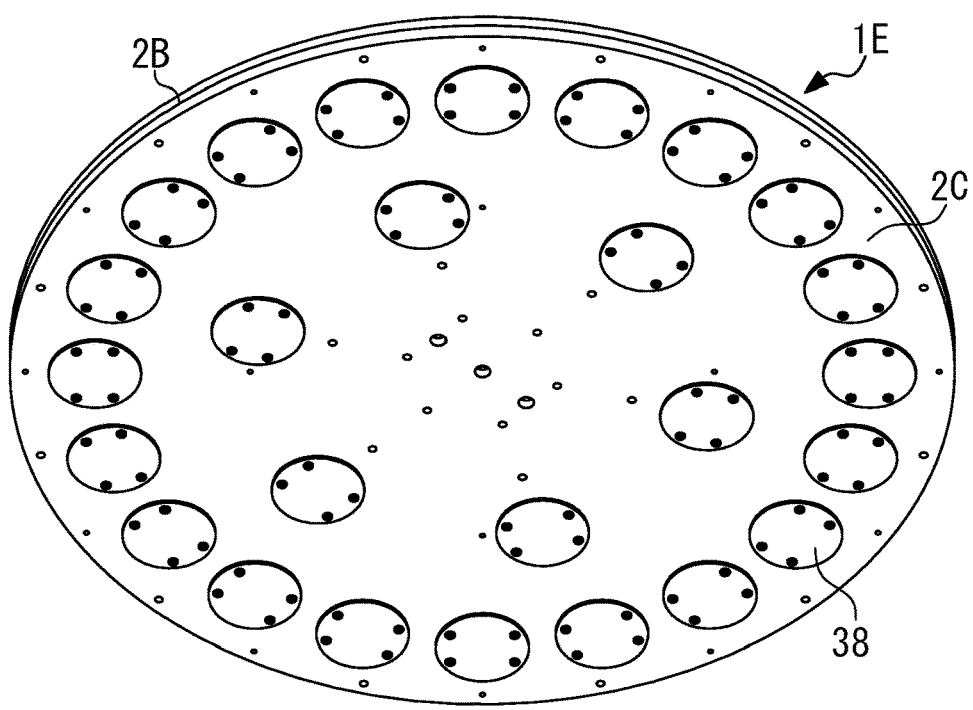
FIG. 26 is a perspective view of an example of a lower surface of suction device 1E.

First end faces 33 and second end faces 34 of swirl flow-forming bodies 3 may be integrated with base plate 2. FIG. 25 is a perspective view of an example of an upper surface of suction device 1E in which base plate 2B serves as first end faces 33 of swirl flow-forming bodies 3 and base plate 2C serves as second end faces 34 of swirl flow-forming bodies 3. FIG. 26 is a perspective view of an example of a lower surface of suction device 1E. Base plates 2B and 2C of suction device 1E are stacked in a manner that base plates 2B and 2C substantially share a central axis. Base plate 2B includes 20 through-holes 32 that are formed along the outer edge of base plate 2B at regular intervals. Base plate 2B also includes six through-holes 32 that are formed, at regular intervals, on a circle having a smaller diameter than the circle on which the above-mentioned through-holes 32 are arranged, and sharing a center with the circle. Base plate 2C includes covers 38 that are attached by use of spacers 39 to cover through-hole 32. The edge part of suction device 1E may be sealed. It is of note that the shape of base plates 2B and 2C, and the number and the arrangement of through-holes 32 are not limited to the example shown in FIGS. 25 and 26.

2-9. Modified Example 9

Figure 27:
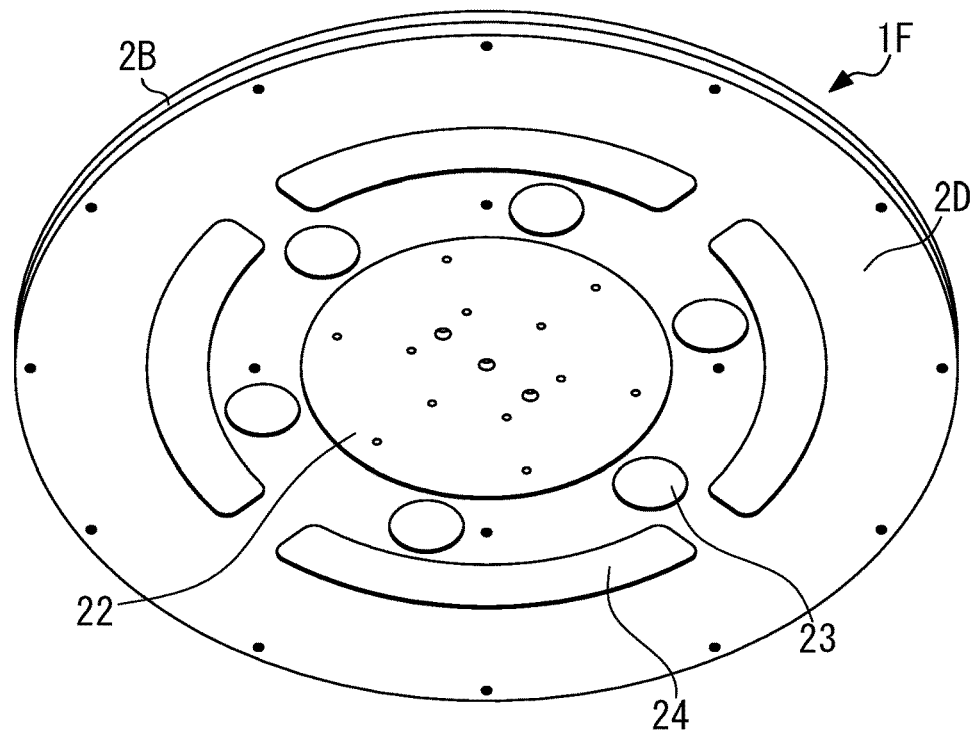
FIG. 27 is a perspective view of an example of a lower surface of suction device 1F.

First end faces 33 and covers 38 of swirl flow-forming bodies 3 may be integrated with base plate 2. FIG. 27 is a perspective view of an example of a lower surface of suction device 1F in which base plate 2B serves as first end faces 33 of swirl flow-forming bodies 3 and base plate 2D serves as covers 38 of swirl flow-forming bodies 3. An upper surface of suction device 1F is shown in FIG. 25. Base plates 2B and 2D of suction device 1F are stacked in a manner that base plates 2B and 2D substantially share a central axis. Base plate 2B includes 20 through-holes 32 that are formed along the outer edge of base plate 2B at regular intervals. Base plate 2B also includes six through-holes 32 that are formed, at regular intervals, on a circle having a smaller diameter than the circle on which the above-mentioned through-holes 32 are arranged, and sharing a center with the circle. Base plate 2D, for purpose of discharging fluid out of suction device 1F, includes circular through-hole 22 that is formed at the center thereof, six circular through-holes 23 that are formed around through-hole 22 at regular intervals, and four arch-like through-holes 24 that are formed around through-holes 23 at regular intervals. The edge part of suction device 1F may be sealed. It is of note that the shape of base plates 2B and 2D, and the number and the arrangement of through-holes 22 to 24 are not limited to the example shown in FIGS. 25 and 27.

Figure 28:
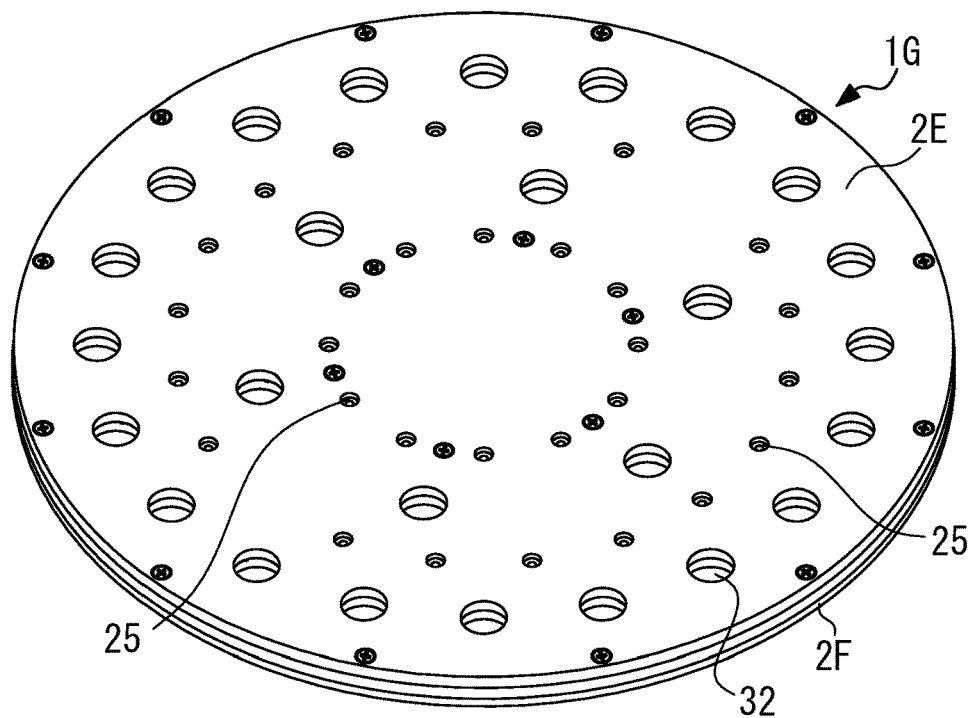
FIG. 28 is a perspective view of an example of an upper surface of suction device 1G.
Figure 29:
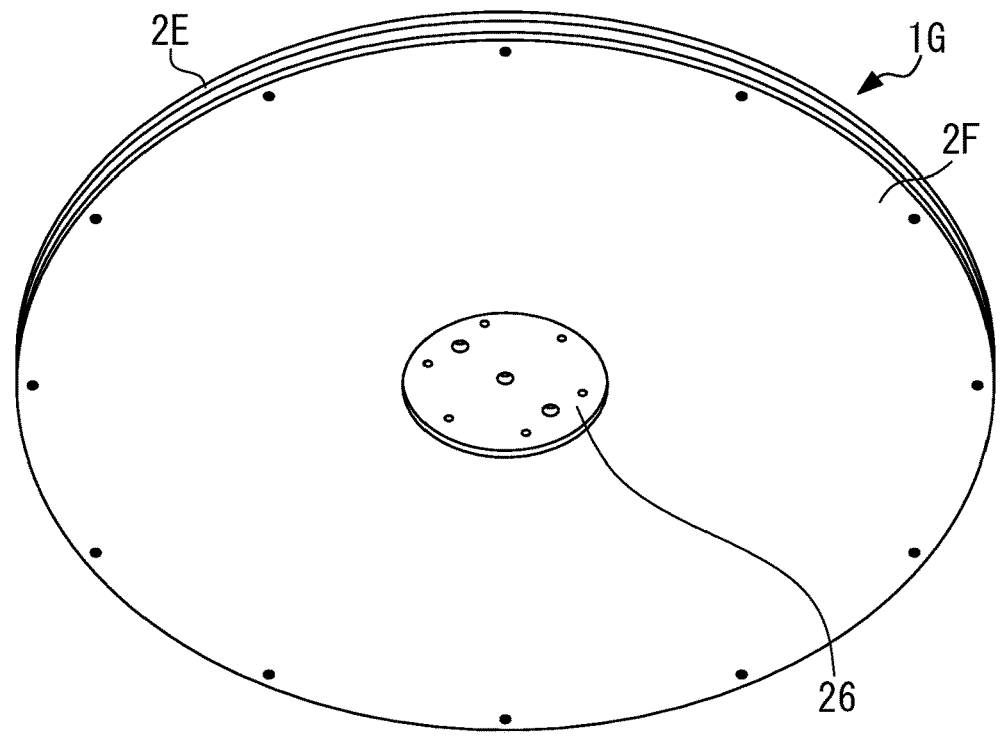
FIG. 29 is a perspective view of an example of a lower surface of suction device 1G.

FIG. 28 is a perspective view of an example of an upper surface of suction device 1G in which base plate 2E serves as first end faces 33 of swirl flow-forming bodies 3 and base plate 2F serves as covers 38 of swirl flow-forming bodies 3. FIG. 29 is a perspective view of an example of a lower surface of suction device 1G. Base plates 2E and 2F of suction device 1G are stacked in a manner such that base plates 2E and 2F substantially share a central axis. The edge part of suction device 1G is sealed. Base plate 2E includes 20 through-holes 32 that are formed along the outer edge of base plate 2E at regular intervals. Base plate 2E also, for discharge of fluid out of suction device 1G, includes 18 through-holes 25 that are formed around a circle having a smaller diameter than the circle around which through-holes 32 are arranged, and sharing a center with the circle. Base plate 2E also includes six through-holes 32 that are formed on a circle having a smaller diameter than the circle on which through-holes 25 are arranged, and sharing a center with the circle. Base plate 2E also, for purpose of discharging fluid out of suction device 1G, includes 18 through-holes 25 that are formed on a circle having a smaller diameter than the circle on which through-holes 32 are arranged, and sharing a center with the circle. Base plate 2F includes through-hole 26 that is formed at the center thereof, in which a member (not shown) for supplying fluid is to be fitted. The member fitted in through-hole 26 seals the same through hole. With the edge part and through-hole 26 of suction device 1G sealed, a fluid coming out from through-hole 32 flows out via through-hole 25 formed on base plate 2E. It is of note that the number and the arrangement of through-holes 32 are not limited to the example shown in FIG. 28. It is also of note that the shape of base plates 2E and 2F, and the shape, the number, and the arrangement of through-holes 25 and 26 are not limited to the example shown in FIGS. 28 and 29.

2-10. Modified Example 10

Figure 30:
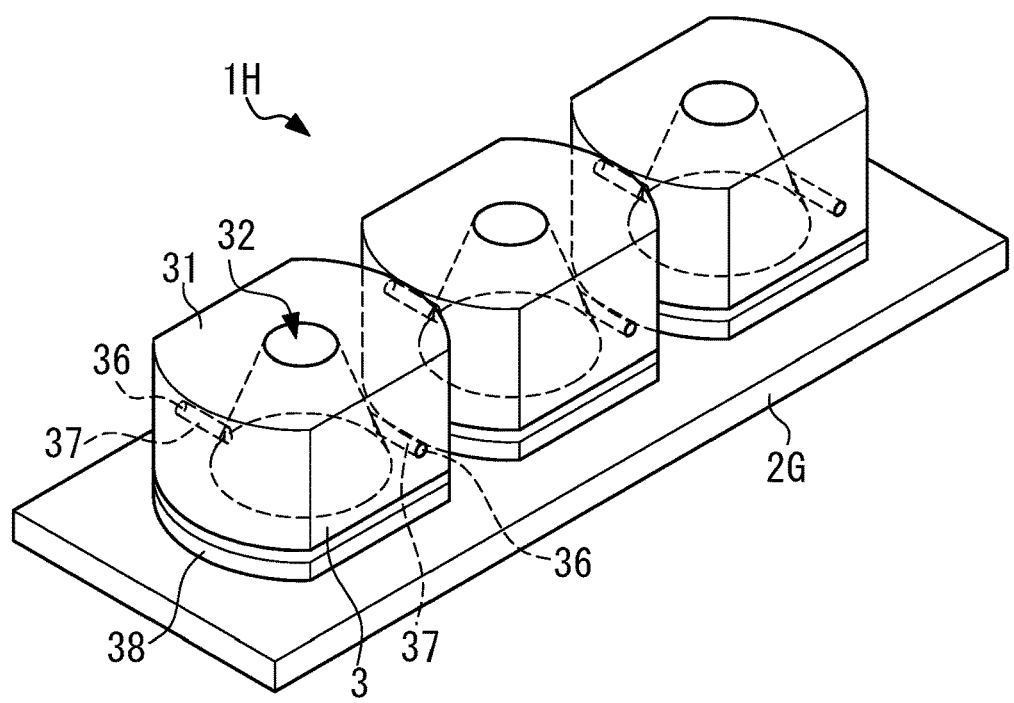
FIG. 30 is a perspective view of an example of suction device 1H.

The shape of base plate 2 is not limited to being circular, and may be elliptical, rectangular, or bifurcated fork shape (see JP 2005-51260 A1). FIG. 30 is a perspective view of an example of suction device 1H including base plate 2G. Suction device 1H includes rectangular base plate 2G and three swirl flow-forming bodies 3 that are fixed on an upper surface of base plate 2G. Swirl flow-forming bodies 3 include cover 38, an upper surface of which is fixed on the upper surface of base plate 2G by use of screws, for example. Swirl flow-forming bodies 3 are arranged on base plate 2G in a straight line at regular intervals. Assuming that a member to which suction is applied is of a rod shape, swirl flow-forming bodies 3 are arranged along the longitudinal direction of the member. Fluid passages 37 are arranged such that they extend approximately perpendicular to the longitudinal direction of base plate 2G. Suction device 1H is able to apply suction to a rod-shaped member so that it can be held, using negative pressures generated in through-holes 32. For example, suction device 1H may apply suction to a mechanical pencil lead or injection needle so that it can be held. It is of note that in FIG. 30, spacers 39 for connecting main body 31 of swirl flow-forming body 3 to cover 38 are not shown. It is also of note that the shape of base plate 2G, and the number and the arrangement of swirl flow-forming bodies 3 are not limited to the example shown in FIG. 30.

Figure 31:
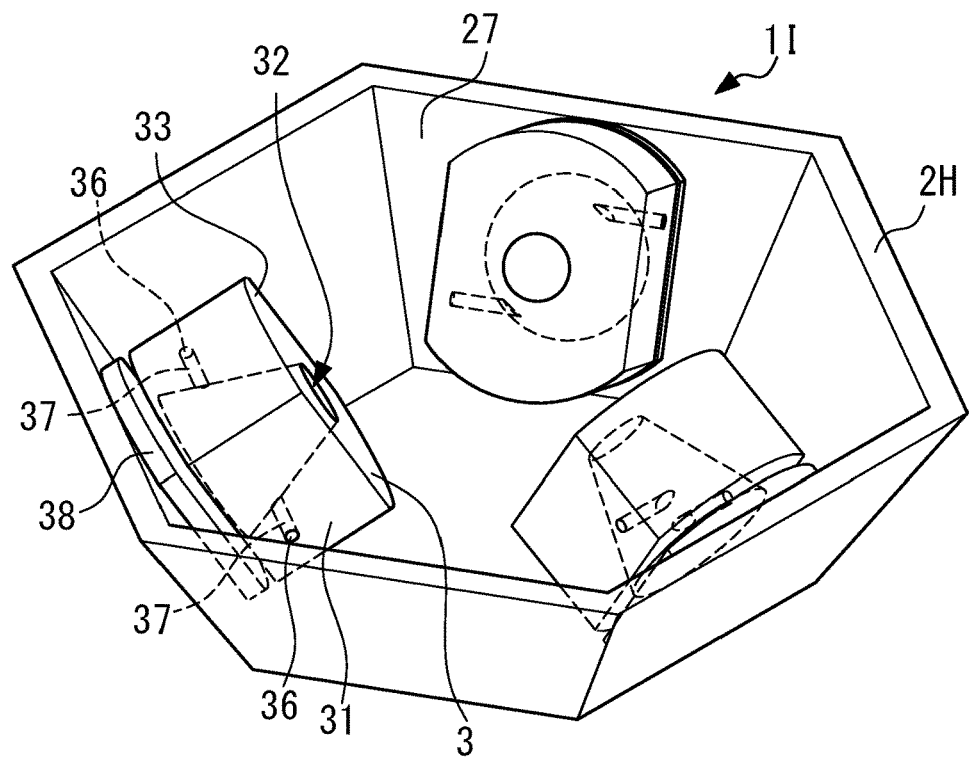
FIG. 31 is a perspective view of an example of suction device 1I.

FIG. 31 is a perspective view of an example of suction device 1I including base plate 2H. Suction device 1I includes base plate 2H that is of a truncated hexagonal pyramid shape and includes a concave part having a hexagonal cross section, and three swirl flow-forming bodies 3 that are fixed on inner side surface 27 of base plate 2H. Swirl flow-forming bodies 3 include cover 38, an upper surface of which is fixed on inner side surface 27 of base plate 2H by use of screws, for example. Swirl flow-forming bodies 3 are fixed on inner side surface 27 such that the openings of first end faces 33 fit a curved surface of a member to which suction is applied. Swirl flow-forming bodies 3 are also arranged on inner side surface 27 at regular intervals. Suction device 1I is able to apply suction to a spherical member so that it can be held, using negative pressures generated in through-holes 32. It is of note that in FIG. 31, spacers for connecting main body 31 of swirl flow-forming body 3 to cover 38 are not shown. It is also of note that the shape of base plate 2H, and the number and the arrangement of swirl flow-forming bodies 3 are not limited to the example shown in FIG. 31.

In the above embodiment, the number of swirl flow-forming body 3 provided in base plate 2 is not limited to six, and may be fewer or may be more. The arrangement of swirl flow-forming body 3 in base plate 2 is not limited to the example shown in FIGS. 1 to 3. For example, swirl flow-forming bodies 3 may not be provided in base plate 2 such that bodies that form a clockwise swirl flow and bodies that form a counterclockwise swirl flow are arranged alternately.

2-11. Modified Example 11

A member to which suction is applied by suction device 1 is not limited to a cooking ingredient, and may be a finished food or an industrial product such as a semiconductor wafer or a glass substrate. The shape of a member to which suction is applied is not limited to being plate-like, and may be any shape including a spherical shape, that enables negative pressure generated within through-hole 32 to be maintained. A member not being plate-like can be prevented from undulating and rotating. A material to which suction is applied may have a certain level of air permeability as long as it can maintain negative pressure generated within through-hole 32.

2-12. Modified Example 12

The shape of the outer periphery of main body 31 of swirl flow-forming body 3 is not limited to being circular, and may be elliptical or rectangular. The taper formed in inner periphery 311 is not limited to a linear taper, and may be a parabolic or exponential taper. Alternatively, inner periphery 311 may include stepped wall in a manner such that a cross-sectional area of through-hole 32 expands with distance from a member. Alternatively, inner periphery 311 may include a spiral groove for guiding a fluid that has flowed out of a jetting port toward the opening of second end face 34.

The cross-sectional shape of through-hole 32 is not limited to being circular, and may be elliptical or rectangular.

First end face 33 and second end face 34 may be uneven.

The number of jetting ports 35 is not limited to two, and may be fewer or may be more. Jetting ports 35 may not be arranged on inner periphery 311 at the center in the axial direction of main body 31, and may be arranged nearer first end face 33 or second end face 34.

The number of fluid passages 37 is not limited to two, and may be fewer or may be more. Fluid passages 37 may be curved. The diameter of fluid passages 37 may be constant.

The shape of cover 38 is not limited to being circular, and may be elliptical or rectangular. Cover 38 may be smaller in size as long as cover 38 covers through-hole 32.

The shape of spacers 39 is not limited to being columnar, and may be a square or elliptical columnar shape. The number of spacers 39 is not limited to four, and may be fewer or may be more. The arrangement of spacers 39 is not limited to the example shown in FIGS. 5 and 6. For example, spacers 39 may extend from outer periphery 312. Spacers 39 may be provided on second end face 34 such that spacers 39 obstruct a flow path of a fluid flowing out of through-hole 32.

2-13. Modified Example 13

Figure 32:
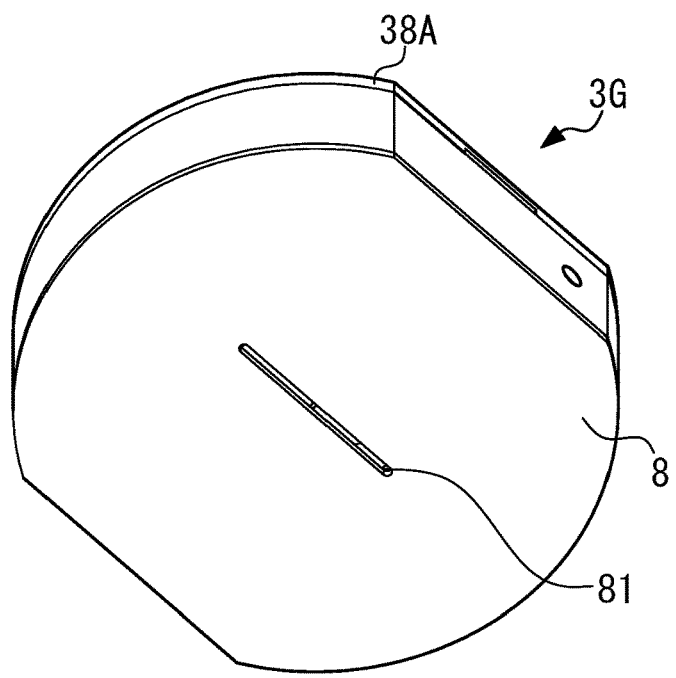
FIG. 32 is a perspective view of an example of swirl flow-forming body 3G to which baffle plate 8 is attached.

On first end face 33 of swirl flow-forming body 3, a baffle plate (see JP 5908136 B, for example) that prevents a member from entering through-hole 32 may be attached. FIG. 32 is a perspective view of an example of swirl flow-forming body 3G to which baffle plate 8 is attached. Baffle plate 8 has a shape similar to that of cover 38A. Baffle plate 8 includes slit 81 that is formed at the center thereof such that slit extends approximately perpendicular to groove 381 (not shown) formed in cover 38A. Assuming that a member to which suction is applied is of a rod shape, the length in the longitudinal direction of slit 81 is set to be shorter than the length in the longitudinal direction of the member, or the width of slit 81 is set to be smaller than the width of the member. Swirl flow-forming body 3G to which baffle plate 8 is attached is able to apply suction to an elongated rod-like member so that the member can be held one by one. For example, swirl flow-forming body 3G may apply suction to a mechanical pencil lead or injection needle so that it can be held. It is of note that the shape of slit 81 is not limited to the example shown in FIG. 32, and may be determined according to a shape of a member to which suction is applied.

2-14. Modified Example 14

A baffle plate may be attached to first end face 33 of swirl flow-forming body 3 via spacers (see JP 5908136, for example).

2-15. Modified Example 15

On first end face 33 of swirl flow-forming body 3, friction members (see JP 2005-142462 A1, for example) for coming into contact with a member to generate friction therebetween, which prevents the member from undulating or rotating, may be attached.

2-16. Modified Example 16

Instead of two fluid passages 37 of swirl flow-forming body 3, electric fans (see JP 2011-138948 A1, for example) may be used.

2-17. Modified Example 17

The direction in which a fluid flows out of through-hole 32 and flows along second end face 34 is not limited to the direction approximately perpendicular to the central axis of main body 31. For example, second end face 34 and cover 38 may be formed such that a fluid that has come out of through-hole 32 is discharged in a direction parallel to the central axis of main body 31 (specifically, in the upper direction relative to main body 31).

The invention claimed is:

1. A swirl flow-forming body, comprising:
   a main body;
   a first end face that is formed at the main body and faces a member to which suction is applied;
   a hole that opens on the first end face;
   a jetting port that is formed on an inner periphery of the main body, the inner periphery facing the hole; and
   a first fluid passage that allows fluid to be discharged into the hole via the jetting port so as to form a swirl flow that generates negative pressure for applying suction to the member, wherein:
   the inner periphery is formed so as to guide fluid discharged via the jetting port, in a direction away from the member, to be discharged from the hole, and
   at least part of the inner periphery is formed such that a cross-sectional area of the hole expands with distance from the member.

2. The swirl flow-forming body according to claim 1, further comprising:
   an outlet port that is formed on the inner periphery at a position farther away from the member than the jetting port;
   a discharge port that is formed on an outside surface of the main body; and
   a second fluid passage that allows fluid that has entered the outlet port to be discharged, wherein the inner periphery is formed so as to guide fluid discharged via the jetting port, toward outlet port.

3. The swirl flow-forming body according to claim 1, wherein the first fluid passage is formed such that fluid discharged through the jetting port flows in a direction away from the member.

4. A suction device, comprising:
a base body; and
at least one swirl flow-forming body according to claim 1, provided in the base body.

5. A swirl flow-forming body, comprising:
a main body;
a first end face that is formed at the main body and faces a member to which suction is applied;
a hole that is a through-hole that opens on the first end face and a second end face opposite to the first end face;
a jetting port that is formed on an inner periphery of the main body, the inner periphery facing the hole; and
a first fluid passage that allows fluid to be discharged into the hole via the jetting port so as to form a swirl flow that generates negative pressure for applying suction to the member, wherein:
the inner periphery is formed so as to guide fluid discharged via the jetting port, in a direction away from the member, to be discharged from the hole,
the inner periphery is formed so as to guide fluid discharged via the jetting port, toward an opening of the second end face, and
the inner periphery is formed such that a cross-sectional area of the hole gradually enlarges with distance from the member from an opening of the first end face to the opening of the second end face.

6. The swirl flow-forming body according to claim 5, wherein the second end face includes a chamfered or rounded opening edge.

7. A swirl flow-forming body, comprising:
a main body;
a first end face that is formed at the main body and faces a member to which suction is applied;
a hole that is a through-hole that opens on the first end face and a second end face opposite to the first end face;
a jetting port that is formed on an inner periphery of the main body, the inner periphery facing the hole; and
a first fluid passage that allows fluid to be discharged into the hole via the jetting port so as to form a swirl flow that generates negative pressure for applying suction to the member;
a plate body; and
a holding member that holds the plate body such that the plate body faces the second end face, and that forms, between the second end face and the plate body, a flow path for fluid that has flowed out from the hole, wherein:
the inner periphery is formed so as to guide fluid discharged via the jetting port, in a direction away from the member, to be discharged from the hole; and
the inner periphery is formed so as to guide fluid discharged via the jetting port, toward an opening of the second end face.

8. The swirl flow-forming body according to claim 7, wherein the holding member holds the plate body such that the plate body is able to move in a penetration direction of the through-hole.

9. A swirl flow-forming body, comprising:
a main body;
a first end face that is formed at the main body and faces a member to which suction is applied;
a hole that opens on the first end face;
a jetting port that is formed on an inner periphery of the main body, the inner periphery facing the hole; and
a first fluid passage that allows fluid to be discharged into the hole via the jetting port so as to form a swirl flow that generates negative pressure for applying suction to the member, wherein:
the first fluid passage is formed so as to allow fluid discharged via the jetting port to flow in a direction away from the member to be discharged from the hole; and
at least part of the inner periphery is formed such that a cross-sectional area of the hole expands with distance from the member.

10. A swirl flow-forming body, comprising:
a main body;
a first end face that is formed at the main body and faces a member to which suction is applied;
a hole that is a through-hole that opens on the first end face and a second end face opposite to the first end face;
a jetting port that is formed on an inner periphery of the main body, the inner periphery facing the hole; and
a first fluid passage that allows fluid to be discharged into the hole via the jetting port so as to form a swirl flow that generates negative pressure for applying suction to the member, wherein:
the first fluid passage is formed so as to allow fluid discharged via the jetting port to flow in a direction away from the member to be discharged from the hole;
the inner periphery is formed so as to guide fluid discharged via the jetting port, toward an opening of the second end face; and
the inner periphery is formed such that a cross-sectional area of the hole gradually enlarges with distance from the member from an opening of the first end face to the opening of the second end face.

11. A swirl flow-forming body, comprising:
a main body;
a first end face that is formed at the main body and faces a member to which suction is applied;
a hole that is a through-hole that opens on the first end face and a second end face opposite to the first end face;
a jetting port that is formed on an inner periphery of the main body, the inner periphery facing the hole; and
a first fluid passage that allows fluid to be discharged into the hole via the jetting port so as to form a swirl flow that generates negative pressure for applying suction to the member;
a plate body; and
a holding member that holds the plate body such that the plate body faces the second end face, and that forms, between the second end face and the plate body, a flow path for fluid that has flowed out from the hole, wherein:
the first fluid passage is formed so as to allow fluid discharged via the jetting port to flow in a direction away from the member to be discharged from the hole;
the inner periphery is formed so as to guide fluid discharged via the jetting port, in a direction away from the member, to be discharged from the hole; and
the inner periphery is formed so as to guide fluid discharged via the jetting port, toward an opening of the second end face.

* * * * *